(12) United States Patent
Kwak et al.

(10) Patent No.: US 11,637,164 B2
(45) Date of Patent: Apr. 25, 2023

(54) DISPLAY DEVICE

(71) Applicant: Samsung Display Co., Ltd., Yongin-Si (KR)

(72) Inventors: Wonkyu Kwak, Seongnam-si (KR); Jae-Sic Lee, Seoul (KR); Wonse Lee, Seoul (KR); Jinhee Jang, Gunpo-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 30 days.

(21) Appl. No.: 17/324,496

(22) Filed: May 19, 2021

(65) Prior Publication Data

US 2022/0069044 A1    Mar. 3, 2022

(30) Foreign Application Priority Data

Aug. 31, 2020 (KR) ......................... 10-2020-0110210

(51) Int. Cl.
*H01L 27/32* (2006.01)
*G09G 3/3266* (2016.01)
*G09G 3/3291* (2016.01)

(52) U.S. Cl.
CPC ....... *H01L 27/3262* (2013.01); *G09G 3/3266* (2013.01); *G09G 3/3291* (2013.01); *H01L 27/3265* (2013.01); *H01L 27/3276* (2013.01)

(58) Field of Classification Search
CPC ......... G09G 2340/0435; G09G 3/3266; G09G 3/3233; G09G 3/3291
See application file for complete search history.

(56) References Cited

U.S. PATENT DOCUMENTS

| | | |
|---|---|---|
| 8,441,421 B2 | 5/2013 | Han et al. |
| 8,547,372 B2 | 10/2013 | Chung et al. |
| 9,368,562 B2 | 6/2016 | Xu |
| 9,489,882 B2 | 11/2016 | Kim et al. |
| 9,653,521 B2 | 5/2017 | Ko |
| 10,380,940 B2 | 8/2019 | Lee et al. |
| 2012/0019504 A1* | 1/2012 | Han ..................... G09G 3/3233 345/212 |
| 2015/0015562 A1* | 1/2015 | Han ..................... G09G 3/3266 345/212 |

(Continued)

FOREIGN PATENT DOCUMENTS

| | | |
|---|---|---|
| KR | 101097325 B1 | 12/2011 |
| KR | 101328979 B1 | 11/2013 |

(Continued)

*Primary Examiner* — Shaheda A Abdin
(74) *Attorney, Agent, or Firm* — Cantor Colburn LLP

(57) ABSTRACT

A display device includes a display panel including pixels. One of the pixels includes a light emitting diode, a first capacitor connected between a power line receiving a power supply voltage and a first reference node, a first transistor connected between the power line and an anode of the light emitting diode, a second transistor connected between a data line and a first electrode of the first transistor, a third transistor including a plurality of sub-transistors connected between a second electrode of the first transistor and the first reference node in series, and a fourth transistor connected to a second reference node among a plurality of second reference nodes between the sub-transistors and receiving an initialization scan signal.

20 Claims, 11 Drawing Sheets

(56) References Cited

U.S. PATENT DOCUMENTS

2017/0148384 A1* 5/2017 Lee .................... G09G 3/3233
2019/0287464 A1 9/2019 Park et al.

FOREIGN PATENT DOCUMENTS

| KR | 101682691 B1 | 12/2016 |
| KR | 1020170017990 A | 2/2017 |
| KR | 1020170060220 A | 6/2017 |
| KR | 101794648 B1 | 11/2017 |
| KR | 1020190109673 A | 9/2019 |

* cited by examiner

DISPLAY DEVICE

This application claims priority to Korean Patent Application No. 10-2020-0110210, filed on Aug. 31, 2020, and all the benefits accruing therefrom under 35 U.S.C. § 119, the content of which in its entirety is herein incorporated by reference.

BACKGROUND

1. Field

Embodiments of the invention relate to a display device. More particularly, embodiments of the invention relate to a display device that operates at a low frequency.

2. Description of the Related Art

Various types of display devices that are applied to electronic items, such as television sets, mobile phones, tablet computers, navigation units, game units, or the like, are being developed. In particular, since mobile electronic items operate using a battery, various efforts are ongoing to reduce power consumption.

One of the efforts to reduce the power consumption is to lower an operating frequency of the display device. When the operating frequency of the display device is lowered in a certain operating environment, such as when displaying a still image, the power consumption is reduced, for example.

SUMMARY

Embodiments of the invention provide a display device capable of preventing a display quality thereof from deteriorating at each operating frequency.

An embodiment of the invention provides a display device including a display panel including a plurality of pixels. A pixel of the plurality of plurality of pixels includes a light emitting diode, a first capacitor connected between a power line receiving a power supply voltage and a first reference node, a first transistor connected between the power line and an anode of the light emitting diode, a second transistor connected between a data line and a first electrode of the first transistor, a third transistor including a plurality of sub-transistors connected between a second electrode of the first transistor and the first reference node in series, and a fourth transistor connected to a second reference node among a plurality of second reference nodes between the plurality of sub-transistors and receiving an initialization scan signal.

In an embodiment, the plurality of sub-transistors of the third transistor may include a first sub-transistor including a first electrode connected to the second electrode of the first transistor, a second electrode connected to the second reference node, and a control electrode receiving a compensation scan signal and a second sub-transistor including a first electrode connected to the second reference node, a second electrode connected to the first reference node, and a control electrode receiving the compensation scan signal. The fourth transistor may include a control electrode receiving the initialization scan signal, a first electrode connected to an initialization voltage line receiving an initialization voltage, and a second electrode connected to the second reference node.

In an embodiment, the compensation scan signal may include a compensation period in one frame, and the compensation period may include a first period that overlaps an initialization period of the initialization scan signal and a second period that does not overlap the initialization period.

In an embodiment, the first transistor may include the first electrode connected to the power line and a control electrode connected to the first reference node. The second transistor may include a control electrode receiving a scan signal, a first electrode connected to the data line, and a second electrode connected to the first electrode of the first transistor.

In an embodiment, the scan signal may include a scan period that overlaps the second period in the one frame.

In an embodiment, the display device may further include a fifth transistor connected between the power line and the first electrode of the first transistor and a sixth transistor connected between the second electrode of the first transistor and the anode of the light emitting diode. The fifth transistor may include a control electrode receiving an emission signal, a first electrode connected to the power line, and a second electrode connected to the first electrode of the first transistor. The sixth transistor may include a control electrode receiving the emission signal, a first electrode connected to the second electrode of the first transistor, and a second electrode connected to the anode of the light emitting diode.

In an embodiment, the display device may further include a seventh transistor connected between the anode of the light emitting diode and the initialization voltage line. The seventh transistor may include a control electrode receiving an emission initialization signal, a first electrode connected to the initialization voltage line, and a second electrode connected to the anode of the light emitting diode.

In an embodiment, the display device may further include a seventh transistor connected between the first electrode of the first transistor and a bias voltage line receiving a bias voltage.

In an embodiment, the seventh transistor may include a control electrode receiving an emission initialization signal, a first electrode connected to the bias voltage line, and a second electrode connected to the first electrode of the first transistor.

In an embodiment, the initialization period, the compensation period, and the scan period may be ahead of an emission initialization period of the emission initialization signal in the one frame, and the initialization period, the compensation period, the scan period, and the emission initialization period may be in a non-emission period of the emission signal in the one frame.

In an embodiment, the display device may further includes a fifth transistor connected to the anode of the light emitting diode and receiving an emission initialization signal. The fourth transistor may include a control electrode receiving the initialization scan signal, a first electrode connected to a first initialization voltage line receiving a first initialization voltage, and a second electrode connected to the second reference node. The fifth transistor may include a control electrode receiving the emission initialization signal, a first electrode connected to a second initialization voltage line receiving a second initialization voltage, and a second electrode connected to the anode of the light emitting diode.

In an embodiment, the display device may further include a second capacitor connected between the second reference node and the power line.

An embodiment of the invention provides a display device including a display panel including a plurality of pixels. A pixel of the plurality of pixels includes a light emitting diode, a first capacitor connected between a power line receiving a power supply voltage and a first reference node, a first transistor connected between the power line and an anode of the light emitting diode, a second transistor connected between a data line and a first electrode of the first transistor and turned on in response to a scan signal, a third transistor connected between a second electrode of the first transistor and the first reference node and turned on in response to a compensation scan signal, and a fourth transistor connected to the second electrode of the first transistor and turned on in response to an initialization scan signal. The compensation scan signal includes a compensation period in one frame, and the compensation period includes a first period that overlaps an initialization period of the initialization scan signal and a second period following the initialization period.

In an embodiment, the third transistor may include a control electrode receiving the compensation scan signal, a first electrode connected to the second electrode of the first transistor, and a second electrode connected to the first reference node. The fourth transistor may include a control electrode receiving the initialization scan signal, a first electrode connected to an initialization voltage line, and a second electrode connected to the second electrode of the first transistor, and the scan signal may include a scan period that overlaps the second period in the one frame.

In an embodiment, the display device may further include a fifth transistor connected between the power line and the first electrode of the first transistor and a sixth transistor connected between the second electrode of the first transistor and the anode of the light emitting diode. The fifth transistor may include a control electrode receiving an emission signal, a first electrode connected to the power line, and a second electrode connected to the first electrode of the first transistor. The sixth transistor may include a control electrode receiving the emission signal, a first electrode connected to the second electrode of the first transistor, and a second electrode connected to the anode of the light emitting diode.

In an embodiment, the display device further may include a seventh transistor connected between the anode of the light emitting diode and the initialization voltage line. The seventh transistor may include a control electrode receiving an emission initialization signal, a first electrode connected to the initialization voltage line, and a second electrode connected to the anode of the light emitting diode.

In an embodiment, the display device may further include a seventh transistor connected between the first electrode of the first transistor and a bias voltage line receiving a bias voltage. The seventh transistor may include a control electrode receiving an emission initialization signal, a first electrode connected to the bias voltage line, and a second electrode connected to the first electrode of the first transistor.

In an embodiment, the initialization period, the compensation period, and the scan period may be ahead of an emission initialization period of the emission initialization signal in the one frame, and the initialization period, the compensation period, the scan period, and the emission initialization period may be in a non-emission period of the emission signal in the one frame.

In an embodiment, the display device may further includes a fifth transistor connected to the anode of the light emitting diode and receiving an emission initialization signal. The fourth transistor may include a control electrode receiving the initialization scan signal, a first electrode connected to a first initialization voltage line receiving a first initialization voltage, and a second electrode connected to the second electrode of the first transistor. The fifth transistor may include a control electrode receiving the emission initialization signal, a first electrode connected to a second initialization voltage line receiving a second initialization voltage, and a second electrode connected to the anode of the light emitting diode.

According to the above, a deviation in luminance at each operating frequency in the display device may be reduced. Thus, a display quality of the display device may be prevented from deteriorating.

BRIEF DESCRIPTION OF THE DRAWINGS

The above and other advantages of the invention will become readily apparent by reference to the following detailed description when considered in conjunction with the accompanying drawings in which.

DETAILED DESCRIPTION

Figure 1:
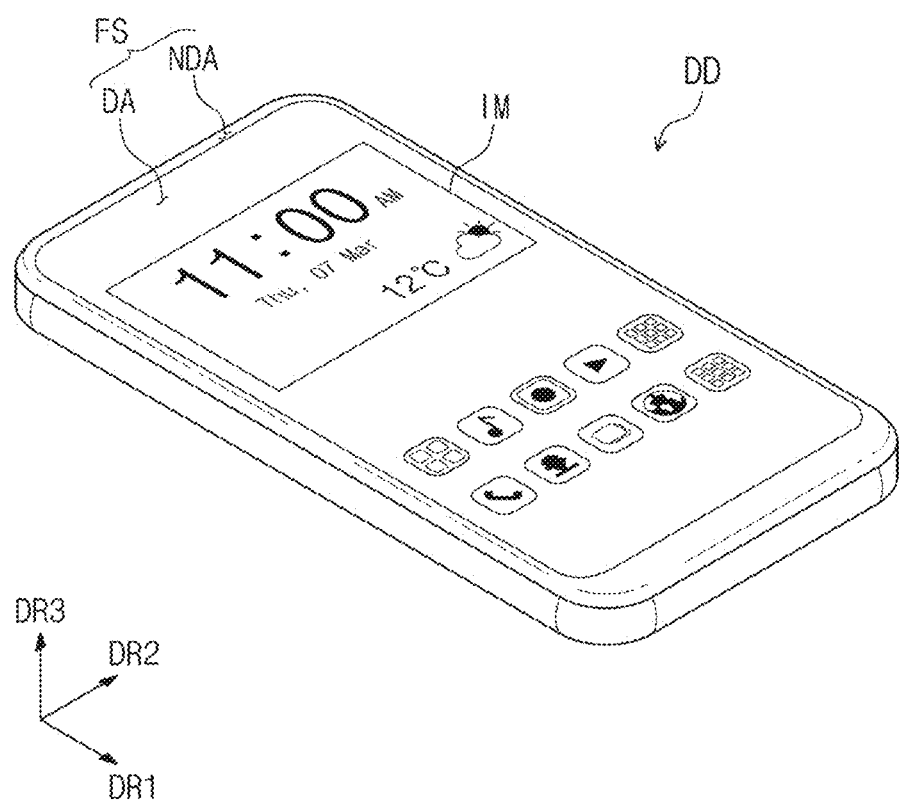
FIG. 1 is a perspective view showing an embodiment of a display device according to the invention.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or periods, these elements, components, regions, layers and/or periods should not be limited by these terms. These terms are only used to distinguish one element, component, region, layer or period from another region, layer or period. Thus, a first element, component, region, layer or period discussed below could be termed a second element, component, region, layer or period without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the invention will be explained in detail with reference to the accompanying drawings.

FIG. 1 is a perspective view showing an embodiment of a display device DD according to the invention.

Referring to FIG. 1, the display device DD has a quadrangular (e.g., rectangular) shape with long sides in a first direction DR1 and short sides in a second direction DR2. However, the shape of the display device DD should not be limited thereto or thereby, and the display device DD may have a variety of shapes.

The display device DD may be a large-sized display device, such as a television set, a monitor, or the like, or a small- and medium-sized display device, such as a mobile phone, a tablet computer, a car navigation unit, a game unit, or the like. However, this is merely an example, and the display device DD may be employed in other electronic items as long as it does not depart from the inventive concept of the disclosure.

Referring to FIG. 1, the display device DD may display an image IM toward a third direction DR3 through a display surface FS substantially parallel to each of the first direction DR1 and the second direction DR2. The display surface FS through which the image IM is displayed may correspond to a front surface of the display device DD.

The display surface FS of the display device DD may be divided into a plurality of areas. The display surface FS of the display device DD may include a display area DA and a non-display area NDA, which are defined therein.

The display area DA may be an area through which the image IM is displayed, and a user views the image IM through the display area DA. The display area DA may have a quadrangular shape. The non-display area NDA may surround the display area DA.

Accordingly, the display area DA may have a shape defined by the non-display area NDA, however, this is merely an example. The non-display area NDA may be defined adjacent to only one side of the display area DA or may be omitted. The display device DD according to the invention may include various embodiments and should not be particularly limited.

The non-display area NDA may be defined adjacent to the display area DA, and the image IM may not be displayed through the non-display area NDA. A bezel area of the display device DD may be defined by the non-display area NDA.

The non-display area NDA may surround the display area DA, however, this is merely an example. The non-display area NDA may be disposed adjacent to only a portion of an edge of the display area DA and should not be particularly limited.

Figure 2:
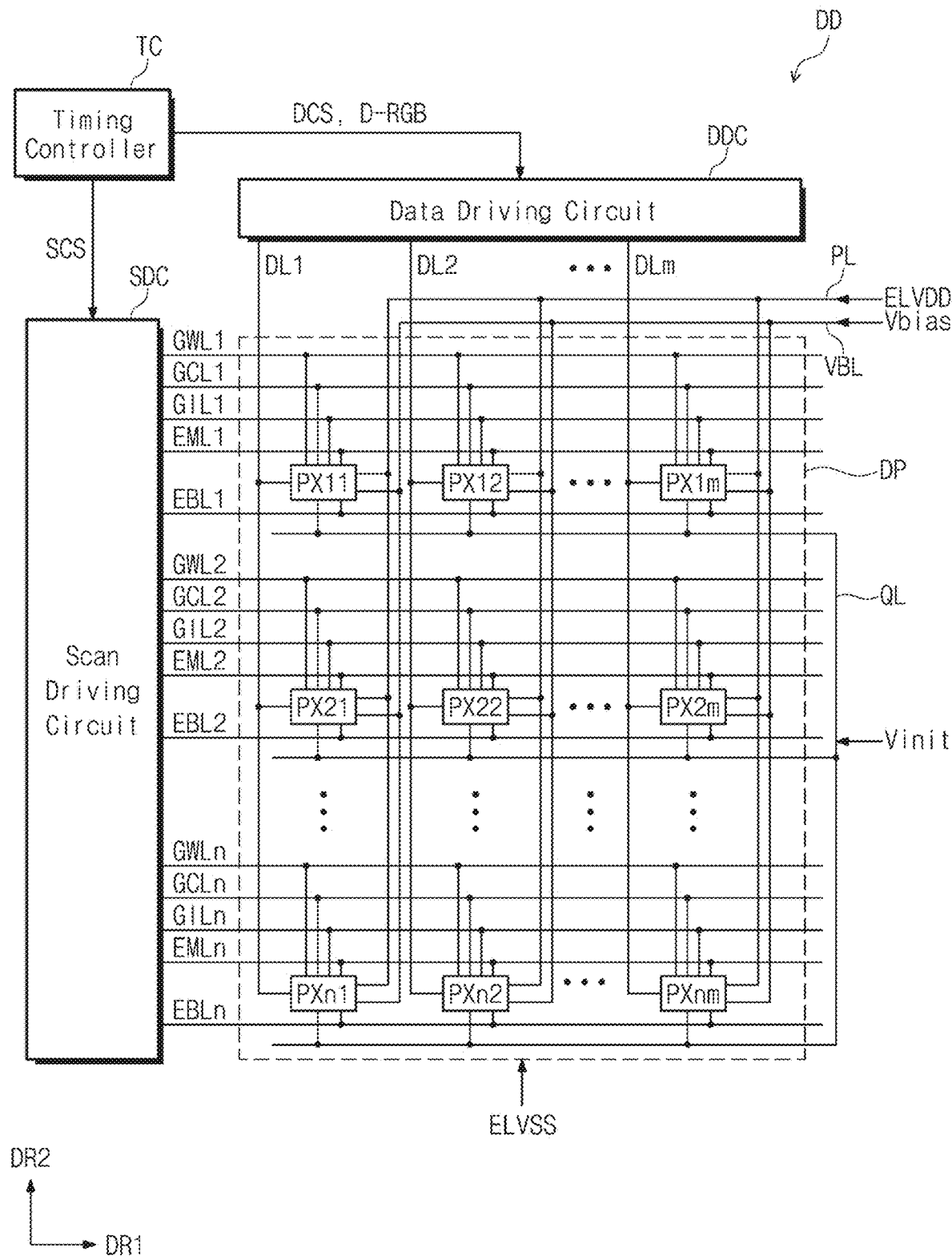
FIG. 2 is a block diagram showing an embodiment of a display device according to the invention.

FIG. 2 is a block diagram showing an embodiment of the display device DD according to the invention.

Referring to FIG. 2, the display device DD may include a timing controller TC, a scan driving circuit SDC, a data driving circuit DDC, and a display panel DP. In the illustrated embodiment, the display panel DP will be described as a light emitting type display panel. The light emitting type display panel may include an organic light emitting display panel or a quantum dot light emitting display panel.

The timing controller TC may receive image signals and a control signal from an external source (not shown). The timing controller TC may convert a data format of the image signals to a format appropriate to an interface between the timing controller TC and the data driving circuit DDC to generate image data D-RGB. The timing controller TC may convert the control signal to generate a scan control signal SCS and a data control signal DCS. The timing controller TC may output the image data D-RGB, the data control signal DCS, and the scan control signal SCS.

The scan driving circuit SDC may receive the scan control signal SCS from the timing controller TC. The scan control signal SCS may include a vertical start signal that starts an operation of the scan driving circuit SDC and a clock signal that determines an output timing of signals. The scan driving circuit SDC may generate a plurality of scan signals, a plurality of compensation scan signals, and a plurality of initialization scan signals. The scan driving circuit SDC may output the scan signals to corresponding scan lines GWL1 to GWLn, may output the compensation scan signals to corresponding compensation scan lines GCL1 to GCLn, and may output the initialization scan signals to corresponding initialization scan lines GIL1 to GILn (n is a natural number). In addition, the scan driving circuit SDC may generate a plurality of emission signals and a plurality of emission initialization signals in response to the scan control signal SCS. The scan driving circuit SDC may output the emission signals to corresponding emission lines EML1 to EMLn and may output the emission initialization signals to corresponding emission initialization lines EBL1 to EBLn.

In FIG. 2, the scan signals, the compensation scan signals, the initialization scan signals, the emission signals, and the emission initialization signals are shown as being output from one scan driving circuit SDC, however, the invention should not be limited thereto or thereby. In an embodiment of the invention, the display device DD may include a plurality of scan driving circuits. Each of the scan driving circuits may output the scan signals, the compensation scan signals, the initialization scan signals, the emission signals, and the emission initialization signals. In addition, in an embodiment of the invention, the scan driving circuit SDC may include a driving circuit that generates and outputs the scan signals, the compensation scan signals, and the initialization scan signals and a driving circuit that generates and outputs the emission signals and the emission initialization signals.

The data driving circuit DDC may receive the data control signal DCS and the image data D-RGB from the timing controller TC. The data driving circuit DDC may convert the image data D-RGB to data signals and may output the data signals to a plurality of data lines DL1 to DLm described below (m is a natural number). The data signals are analog voltages corresponding to grayscale values of the image data D-RGB.

The display panel DP includes the scan lines GWL1 to GWLn, the compensation scan lines GCL1 to GCLn, the initialization scan lines GIL1 to GILn, the emission lines EML1 to EMLn, the emission initialization lines EBL1 to EBLn, the data lines DL1 to DLm, a power line PL, an initialization voltage line QL, a bias voltage line VBL, a common voltage line RL (refer to FIG. 3A), and a plurality of pixels PX11 to PXnm. The scan lines GWL1 to GWLn, the compensation scan lines GCL1 to GCLn, the initialization scan lines GIL1 to GILn, the emission lines EML1 to EMLn, and the emission initialization lines EBL1 to EBLn extend in the first direction DR1 and are arranged in the second direction DR2 crossing the first direction DR1.

The data lines DL1 to DLm are insulated from and cross the scan lines GWL1 to GWLn, the compensation scan lines GCL1 to GCLn, the initialization scan lines GIL1 to GILn, the emission lines EML1 to EMLn, and the emission initialization lines EBL1 to EBLn. Each of the pixels PX11 to PXnm is connected to a corresponding scan line among the scan lines GWL1 to GWLn, a corresponding compensation scan line among the compensation scan lines GCL1 to GCLn, and a corresponding initialization scan line among the initialization scan lines GIL1 to GILn. A connection relation between the pixels PX11 to PXnm and the signal lines GWL1 to GWLn, GCL1 to GCLn, and GIL1 to GILn may be changed depending on the configuration of the driving circuit of the pixels PX11 to PXnm.

The power line PL receives a power supply voltage ELVDD. The initialization voltage line QL receives an initialization voltage Vinit. The bias voltage line VBL receives a bias voltage Vbias. The initialization voltage Vinit has a level lower than that of the power supply voltage ELVDD. A common voltage ELVSS is applied to the display panel DP. The common voltage ELVSS has a level lower than that of the power supply voltage ELVDD.

In the above descriptions, the display device DD in the embodiment has been described with reference to FIG. 2, however, the display device DD of the invention should not be limited thereto or thereby. Some of the signal lines GWL1 to GWLn, GCL1 to GCLn, and GIL1 to GILn may be omitted or other signals may be added to the signal lines GWL1 to GWLn, GCL1 to GCLn, and GIL1 to GILn according to the configuration of the pixel. In addition, the connection relation between each of the pixels PX11 to PXnm and the signal lines GWL1 to GWLn, GCL1 to GCLn, and GIL1 to GILn may be changed.

The pixels PX11 to PXnm may be grouped into a plurality of groups that includes light emitting diodes OLED (refer to FIG. 3A) emitting color lights having different colors from each other. In an embodiment, the pixels PX11 to PXnm may include red pixels emitting a red color light, green pixels emitting a green color light, and blue pixels emitting a blue color light, for example. The light emitting diodes OLED of the red pixels, the light emitting diodes OLED of the green pixels, and the light emitting diodes OLED of the blue pixels may include light emitting layers with different materials from each other.

Each of the pixels PX11 to PXnm may include a plurality of transistors and a capacitor electrically connected to the transistors. At least one of the scan driving circuit SDC and the data driving circuit DDC may include a plurality of transistors provided through the same process as a pixel driving circuit.

The signal lines GWL1 to GWLn, GCL1 to GCLn, and GIL1 to GILn, the pixels PX11 to PXnm, the scan driving circuit SDC, and the data driving circuit DDC may be disposed on a base substrate through multiple photolithography processes.

Figure 3A:
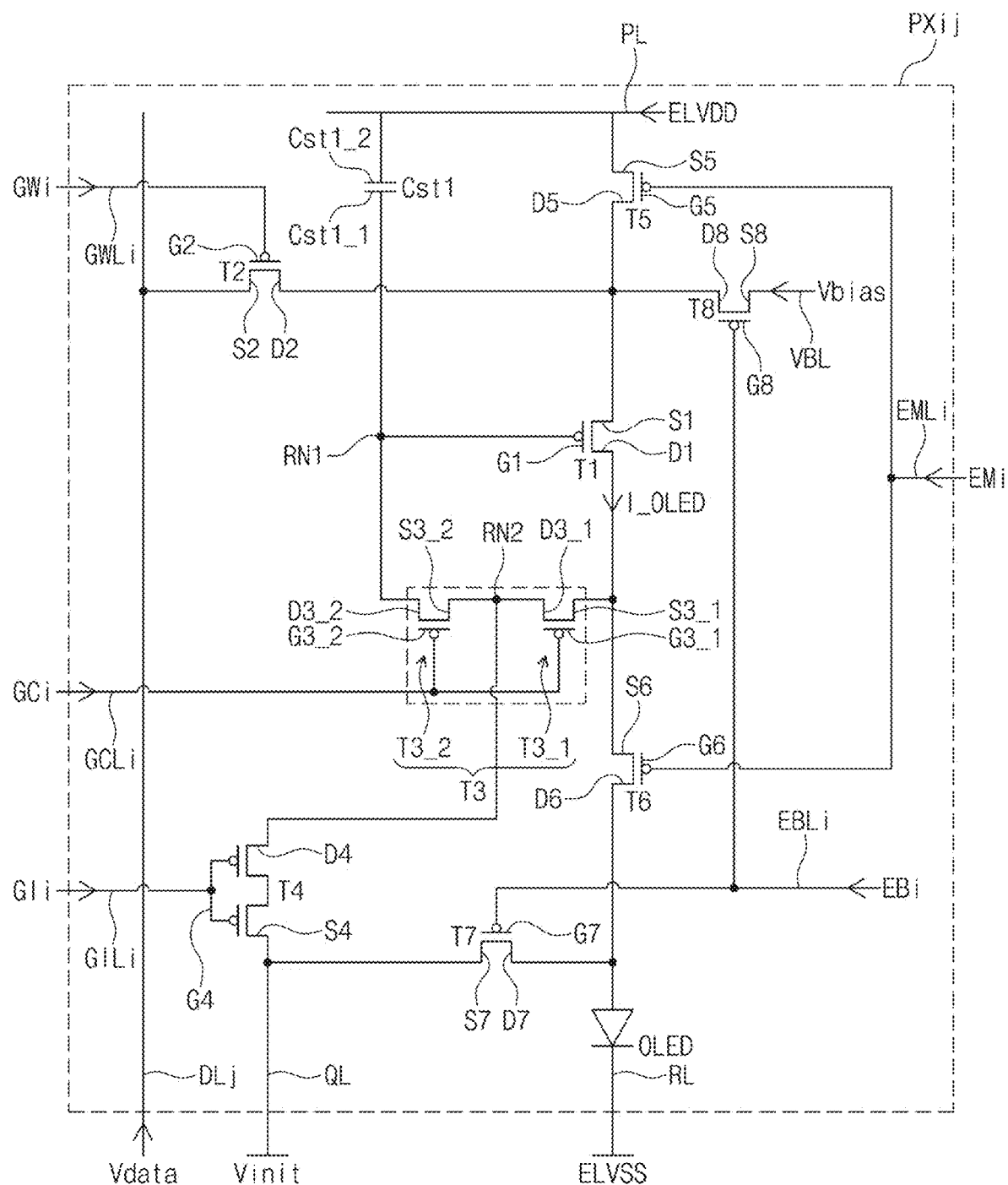
FIGS. 3A and 3B are equivalent circuit diagrams showing an embodiment of a pixel according to the invention.
Figure 3B:
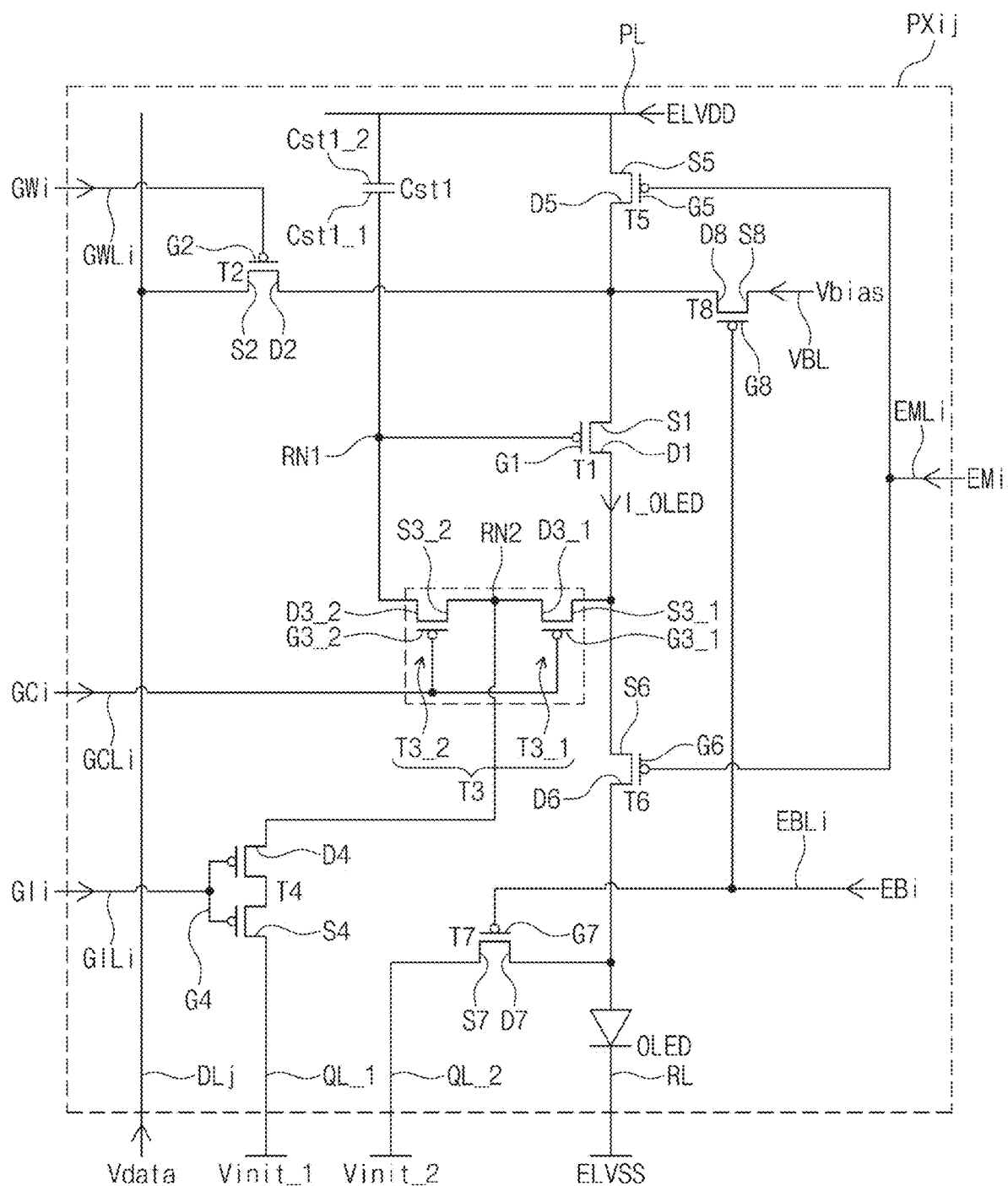
Figure 4:
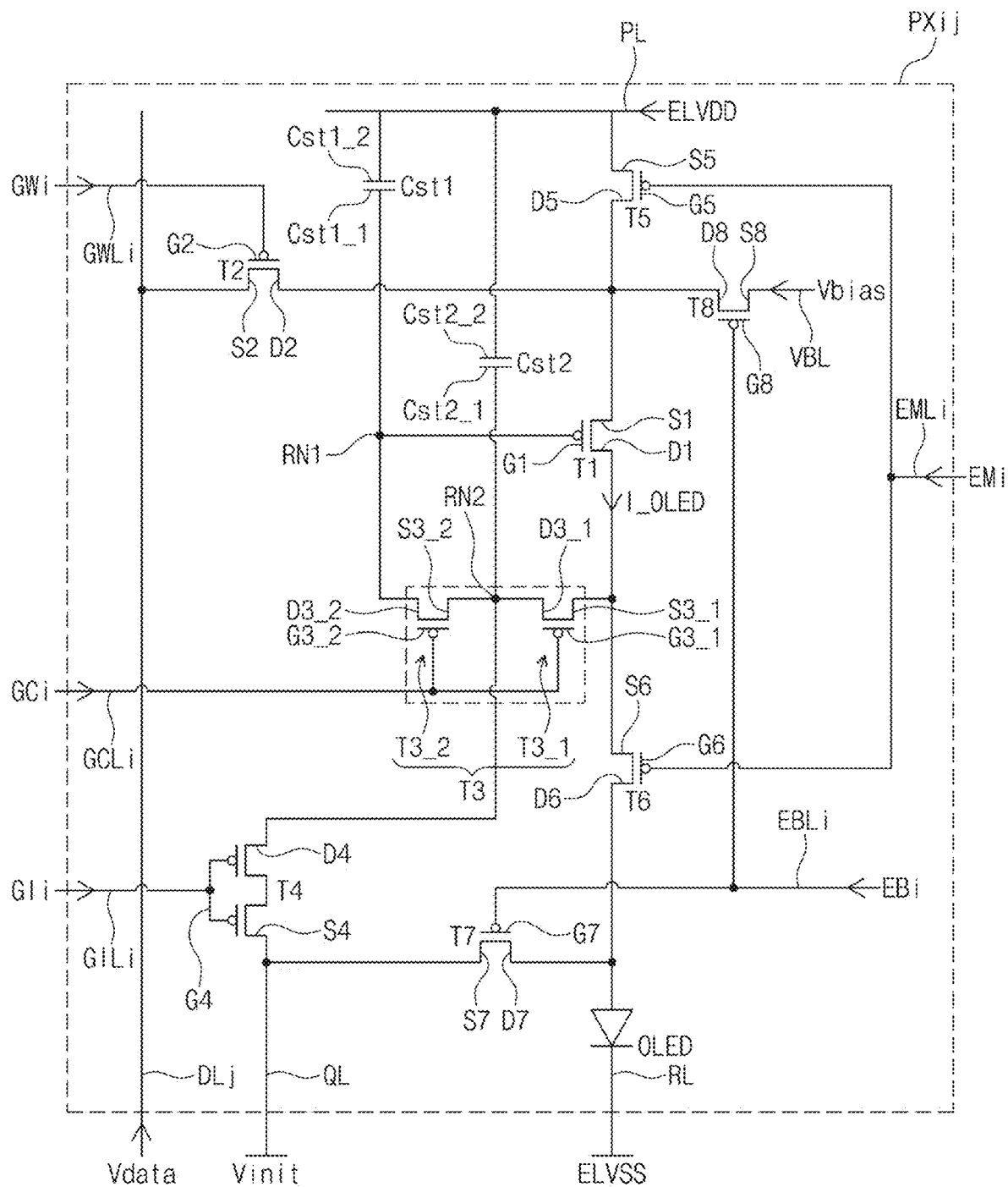
FIG. 4 is an equivalent circuit diagram showing an embodiment of a pixel according to the invention.
Figure 5:
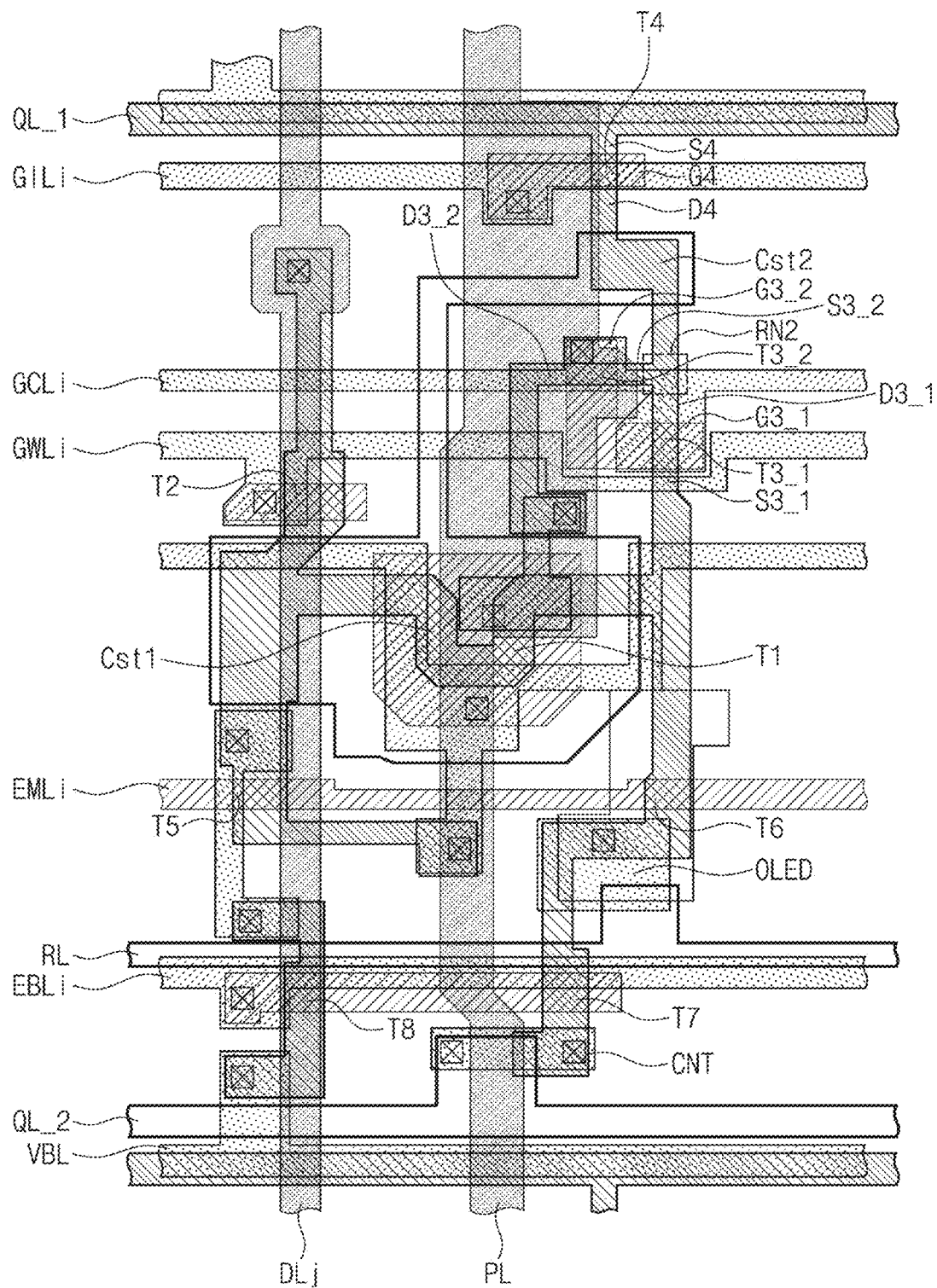
FIG. 5 is a plan view showing a layout of an embodiment of a pixel according to the invention.

FIGS. 3A and 3B are equivalent circuit diagrams showing an embodiment of a pixel PXij according to the invention, FIG. 4 is an equivalent circuit diagram showing an embodiment of a pixel PXij according to the invention, and FIG. 5 is a plan view showing an embodiment of a pixel according to the invention.

Referring to FIGS. 3A, 3B, 4, and 5, the pixel PXij connected to an i-th scan line GWLi among the scan lines GWL1 to GWLn and a j-th data line DLj among the data lines DL1 to DLm is shown (i and j are natural numbers).

In the illustrated embodiment, the pixel PXij may include first, second, third, fourth, fifth, sixth, seventh, and eighth transistors T1 to T8 and a first capacitor Cst1. In the illustrated embodiment, each of the first to eighth transistors T1 to T8 will be described as a P-type transistor, however, it should not be limited thereto or thereby. Each of the first to eighth transistors T1 to T8 may be implemented as the P-type transistor or an N-type transistor. In another embodiment, some transistor of the first to eighth transistors T1 to T8 may be the P-type transistor, and the other transistors of the first to eighth transistors T1 to T8 may be the N-type transistor. In addition, the number of the transistors included in the pixel PXij should not be limited thereto or thereby. That is, at least one of the first to eighth transistors T1 to T8 may be omitted, and as another way, one or more transistors may be added to the pixel PXij.

In the illustrated embodiment, the first transistor T1 may be a driving transistor, and the second transistor T2 may be a switching transistor. The first capacitor Cst1 is connected between the power line PL receiving the power supply voltage ELVDD and a first reference node RN1. The first capacitor Cst1 includes a first electrode Cst1_1 connected to the first reference node RN1 and a second electrode Cst1_2 connected to the power line PL. Hereinafter, each of the first to eighth transistors T1 to T8 will be described as including a first electrode, a second electrode, and a control electrode, respectively, and the first electrode, the second electrode, and the control electrode are also referred to as a source, a drain, and a gate, respectively.

The first transistor T1 is connected between the power line PL and the light emitting diode OLED. A source S1 of the first transistor T1 is electrically connected to the power line PL. In the invention, the expression "a transistor is electrically connected to a signal line, or a transistor is electrically connected to another transistor" means that "any one of a source, a drain, and a gate of a transistor has a unitary shape with the signal line or another transistor or any one of the source, drain, and the gate of the transistor is connected to the signal line or another transistor through a connection electrode". Another transistor may be further disposed between the source S1 of the first transistor T1 and the power line PL.

A drain D1 of the first transistor T1 is electrically connected to an anode of the light emitting diode OLED. Another transistor may be further disposed between the drain D1 of the first transistor T1 and the anode of the light emitting diode OLED. A gate G1 of the first transistor T1 is electrically connected to the first reference node RN1.

The second transistor T2 is connected between the j-th data line DLj and the source S1 of the first transistor T1. The second transistor T2 includes a first electrode, a second electrode, and a control electrode, the first electrode is a source S2, the second electrode is a drain D2, and the control electrode is a gate G2. The source S2 of the second transistor T2 is electrically connected to the j-th data line DLj, and the drain D2 of the second transistor T2 is electrically connected to the source S1 of the first transistor T1. In the illustrated embodiment, the gate G2 of the second transistor T2 is electrically connected to the i-th scan line GWLi.

The third transistor T3 is connected between the first reference node RN1 and the drain D1 of the first transistor T1. The third transistor T3 includes a plurality of sub-transistors connected to each other in series. Nodes to which the sub-transistors are electrically connected may be also referred to as second reference nodes. In an embodiment, the third transistor T3 may include a first sub-transistor T3_1 and a second sub-transistor T3_2. The first sub-transistor T3_1 may include a first electrode, a second electrode, and a control electrode, the first electrode may be a source S3_1, the second electrode may be a drain D3_1, and the control electrode may be a gate G3_1. The second sub-transistor T3_2 may include a first electrode, a second electrode, and a control electrode, the first electrode may be a source S3_2, the second electrode may be a drain D3_2, and the control electrode may be a gate G3_2. The drain D3_1 of the first sub-transistor T3_1 and the source S3_2 of the second sub-transistor T3_2 are electrically connected to each other. In this case, a node at which the drain D3_1 of the first sub-transistor T3_1 and the source S3_2 of the second sub-transistor T3_2 are connected to each other may be defined as a second reference node RN2. The first sub-transistor T3_1 may be connected between the drain D1 of the first transistor T1 and the second reference node RN2. The first sub-transistor T3_1 may include the source S3_1 connected to the drain D1 of the first transistor T1, the drain D3_1 electrically connected to the second reference node RN2, and a gate G3_1 electrically connected to an i-th compensation scan line GCLi. The second sub-transistor T3_2 may be connected between the drain D3_1 of the first sub-transistor T3_1 and the first reference node RN1. The second sub-transistor T3_2 may include the source S3_2 electrically connected to the second reference node RN2, the drain D3_2 electrically connected to the first reference node RN1, and the gate G3_2 electrically connected to the i-th compensation scan line GCLi. As shown in FIG. 5, the gates G3_1 and G3_2 of the first and second sub-transistors T3_1 and T3_2 may be implemented as a single electrode. The electrode may be connected to the i-th compensation scan line GCLi through a contact hole CNT. Also, as an example, the source S3_2 of the second sub-transistor T3_2 and the drain D3_1 of the first sub-transistor T3_1 may be unitary with each other.

Figure 7:
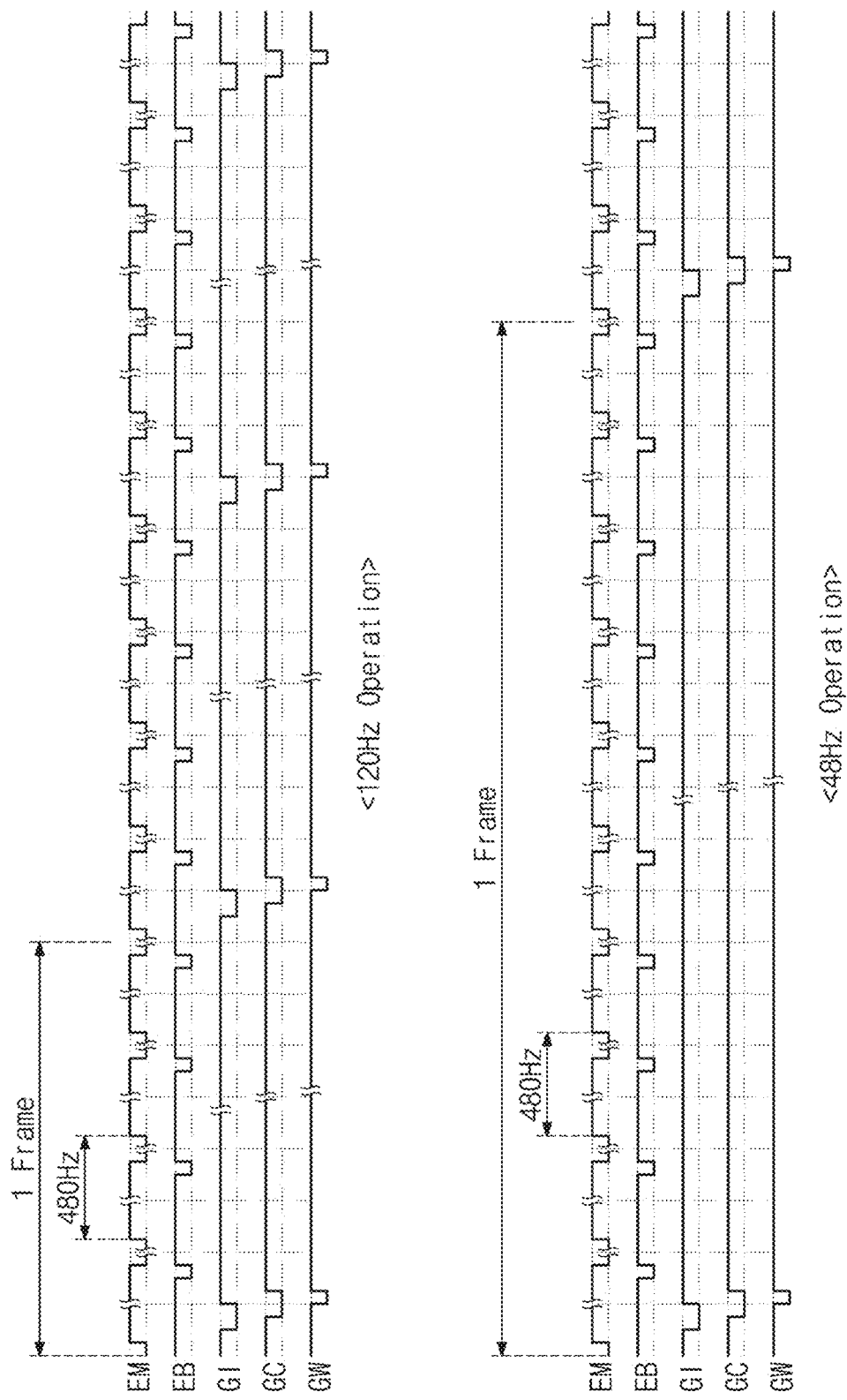
FIG. 7 is a waveform diagram showing driving signals used to drive a pixel shown in FIG. 2 according to an operating frequency of a display device.

The fourth transistor T4 may be connected to one second reference node among the second reference nodes and may receive the initialization scan signal GI (refer to FIG. 7). In an embodiment, when the third transistor T3 includes the first and second sub-transistors T3_1 and T3_2, the fourth transistor T4 may be connected between the second reference node RN2 and the initialization voltage line QL. The fourth transistor T4 may include a first electrode, a second electrode, and a control electrode, the first electrode may be a source S4, the second electrode may be a drain D4, and the control electrode may be a gate G4. The drain D4 of the fourth transistor T4 may be electrically connected to the second reference node RN2, and the source S4 of the fourth transistor T4 may be electrically connected to the initialization voltage line QL. In the illustrated embodiment, the gate G4 of the fourth transistor T4 may be electrically connected to an i-th initialization scan line GIL1 The fourth transistor T4 may receive an i-th initialization scan signal Gli.

Each of the third transistor T3 and the fourth transistor T4 may include two or more gates. In an embodiment, the third transistor T3 may include three or more sub-transistors and may include three or more gates included in the sub-transistors. As the third transistor T3 and the fourth transistor T4 include the plural gates, a leakage current of the pixel PXij may be reduced.

The fifth transistor T5 may be connected between the power line PL and the source S1 of the first transistor T1. The fifth transistor T5 may include a first electrode, a second electrode, and a control electrode, the first electrode may be a source S5, the second electrode may be a drain D5, and the control electrode may be a gate G5. The source S5 of the fifth transistor T5 may be electrically connected to the power line PL, and the drain D5 of the fifth transistor T5 may be electrically connected to the source S1 of the first transistor T1. In the illustrated embodiment, the gate G5 of the fifth transistor T5 may be electrically connected to an i-th emission line EMLi.

The sixth transistor T6 may be connected between the drain D1 of the first transistor T1 and the light emitting diode OLED. The sixth transistor T6 may include a first electrode, a second electrode, and a control electrode, the first electrode may be a source S6, the second electrode may be a drain D6, and the control electrode may be a gate G6. The source S6 of the sixth transistor T6 may be electrically connected to the drain D1 of the first transistor T1, and the drain D6 of the sixth transistor T6 may be electrically connected to the anode of the light emitting diode OLED. In the illustrated embodiment, the gate G6 of the sixth transistor T6 may be electrically connected to the i-th emission line EMLi.

The seventh transistor T7 may be connected between the anode of the light emitting diode OLED and the initialization voltage line QL. The seventh transistor T7 may include a first electrode, a second electrode, and a control electrode, the first electrode may be a source S7, the second electrode may be a drain D7, and the control electrode may be a gate G7. The source S7 of the seventh transistor T7 may be electrically connected to the initialization voltage line QL, and the drain D7 of the seventh transistor T7 may be electrically connected to the anode of the light emitting diode OLED. In the illustrated embodiment, the gate G7 of the seventh transistor T7 may be electrically connected to an i-th emission initialization line EBLi. The seventh transistor T7 may receive an i-th emission initialization signal EBi.

The eighth transistor T8 may be connected between the source S1 of the first transistor T1 and the bias voltage line VBL. The eighth transistor T8 may include a first electrode, a second electrode, and a control electrode, the first electrode may be a source S8, the second electrode may be a drain D8, and the control electrode may be a gate G8. The source S8 of the eighth transistor T8 may be electrically connected to the bias voltage line VBL, and the drain D8 of the eighth transistor T8 may be electrically connected to the source S1 of the first transistor T1. In the illustrated embodiment, the gate G8 of the eighth transistor T8 may be electrically connected to the i-th emission initialization line EBLi.

Hereinafter, descriptions on the same elements as those described with reference to FIG. 3A will be omitted Referring to FIG. 3B, a fourth transistor T4 may be connected to a first initialization voltage line QL_1 receiving a first initialization voltage Vinit 1, and a seventh transistor T7 may be connected to a second initialization voltage line QL_2 receiving a second initialization voltage Vinit_2. In an embodiment, the second initialization voltage Vinit_2 may have a level lower than that of the first initialization voltage Vinit 1, however, it should not be limited thereto or thereby.

The fourth transistor T4 may be connected between a second reference node RN2 and the first initialization voltage line QL_1. A drain D4 of the fourth transistor T4 may be electrically connected to the second reference node RN2, and a source S4 of the fourth transistor T4 may be electrically connected to the first initialization voltage line QL_1. In the illustrated embodiment, a gate G4 of the fourth transistor T4 may be electrically connected to an i-th initialization scan line GILi.

The seventh transistor T7 may be connected between an anode of a light emitting diode OLED and the second initialization voltage line QL_2. A source S7 of the seventh transistor T7 may be electrically connected to the second initialization voltage line QL_2, and a drain D7 of the seventh transistor T7 may be electrically connected to the anode of the light emitting diode OLED. In the illustrated embodiment, a gate G7 of the seventh transistor T7 may be electrically connected to an i-th emission initialization line EBLi.

The source S4 of the fourth transistor T4 may be connected to the first initialization voltage line QL_1, and when the fourth transistor T4 is turned on, the first initialization voltage Vinit 1 may be applied to the drain D4 of the fourth transistor T4. The source S7 of the seventh transistor T7 may be connected to the second initialization voltage line QL_2, and when the seventh transistor T7 is turned on, the second initialization voltage Vinit_2 may be applied to the drain D7 of the seventh transistor T7. When compared with FIG. 3A, a deviation according to the manufacture process of the display panel DP (refer to FIG. 2) may be compensated for by varying voltages applied to the fourth transistor T4 and the seventh transistor T7.

FIG. 4 is an equivalent circuit diagram showing an embodiment of a pixel PXij according to the invention. Hereinafter, descriptions on the same elements as those described with reference to FIG. 3A will be omitted in FIG. 4.

Referring to FIG. 4, the pixel PXij may further include a second capacitor Cst2.

The second capacitor Cst2 may be connected between the second reference node RN2 and the power line PL. The second capacitor Cst2 may include a first electrode Cst2_1 connected to the second reference node RN2 and a second electrode Cst2_2 connected to the power line PL.

A parasitic capacitor may exist between the first and second sub-transistors T3_1 and T3_2 and the i-th compensation scan line GCLi. Accordingly, an electric potential of the second reference node RN2 may be changed together with a variation of an i-th compensation scan signal GCi applied to the i-th compensation scan line GCLi electrically connected to the gate G3_1 of the first sub-transistor T3_1 and the gate G3_2 of the second sub-transistor T3_2 due to a coupling effect of the parasitic capacitor. Therefore, when a voltage of the i-th compensation scan signal GCi is changed to a high level from a low level, the electric potential of the second reference node RN2 may increase, and an electric potential of the gate G1 of the first transistor T1 connected to the first sub-transistor T3_1 may increase. In this case, when the second capacitor Cst2 is connected between the second reference node RN2 and the power line PL according to the invention, the parasitic capacitor and the second capacitor Cst2 are connected to each other in parallel, and thus, the variation in electric potential of the second reference node RN2, which is caused by the variation of the i-th compensation scan signal GCi, may be prevented. In an embodiment, a capacitance of the second capacitor Cst2 may be greater than a capacitance of the parasitic capacitor.

Figure 6:
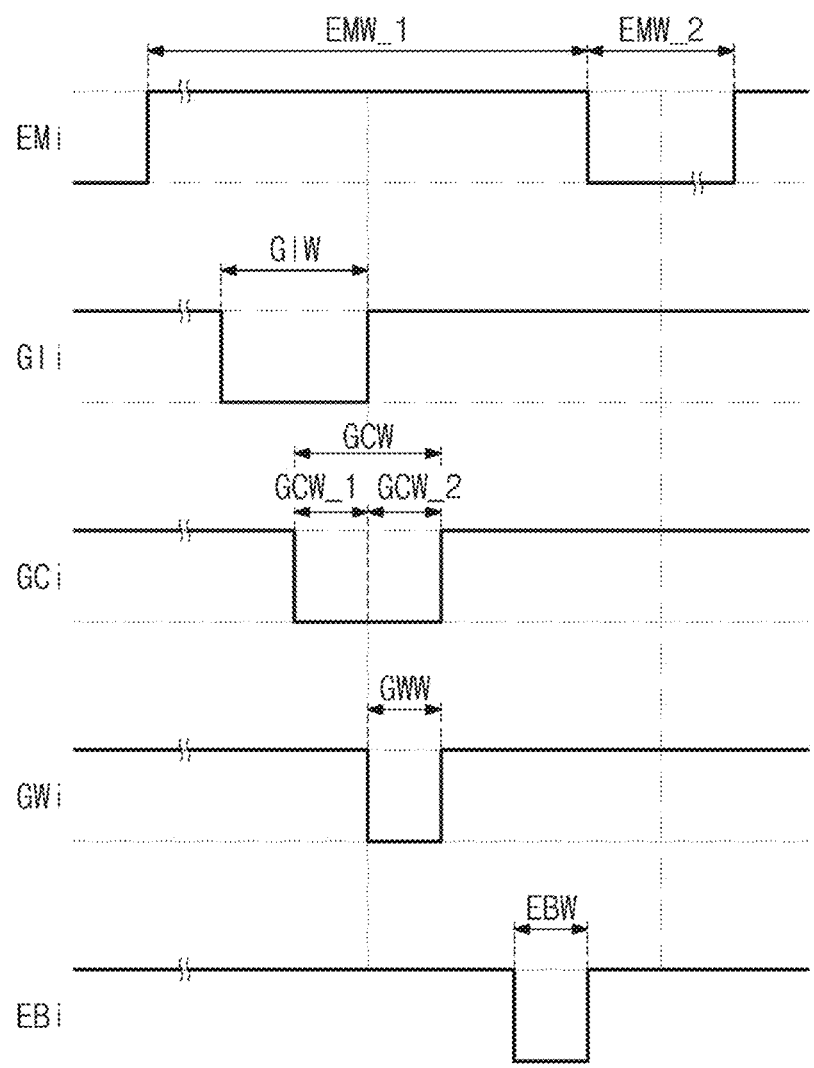
FIG. 6 is a waveform diagram showing driving signals used to drive the pixel shown in FIG. 3A.

FIG. 6 is a waveform diagram showing driving signals used to drive the pixel shown in FIG. 3A, and FIG. 7 is a waveform diagram showing driving signals used to drive the pixel shown in FIG. 2.

FIG. 6 shows a portion of one frame period. Referring to FIGS. 1, 2, 3A and 6, the display device DD displays the image IM every frame period. During one frame period, each of the scan lines GWL1 to GWLn, the compensation scan lines GCL1 to GCLn, the initialization scan lines GIL1 to GILn, the emission lines EML1 to EMLn, and the emission initialization lines EBL1 to EBLn are sequentially scanned.

Each of the i-th signals Gli, GCi, GWi, EBi and the i-th emission signal EMi may have the high level during some periods and the low level during some periods. In this case, the N-type transistors are turned on when corresponding signals have the high level, and the P-type transistors are turned on when corresponding signals have the low level. Hereinafter, in the embodiment of the invention, the first to eighth transistors T1 to T8 included in the pixel PXij will be described as the P-type transistor. A high level period of the i-th emission signal EMi is also referred to as a non-emission period EMW_1, and a low level period of the i-th emission signal EMi is also referred to as an emission period EMW_2.

In the non-emission period EMW_1 of one frame (1 Frame), the i-th initialization scan signal GIi is applied to the i-th initialization scan line GILi. A low level period of the i-th initialization scan signal GIi is also referred to as an initialization period GIW. When the fourth transistor T4 is turned on in the initialization period GIW, the initialization voltage Vinit is applied to the second reference node RN2 through the fourth transistor T4.

Then, the i-th compensation scan signal GCi is applied to the i-th compensation scan line GCLi. A low level period of the i-th compensation scan signal GCi is also referred to as a compensation period GCW. The compensation period GCW includes a first period GCW_1 that overlaps the initialization period GIW and a second period GCW_2 that does not overlap the initialization period GIW. When the third transistor T3 is turned on in the first period GCW_1, the initialization voltage Vinit applied to the second reference node RN2 through the fourth transistor T4 is applied to the gate G1 of the first transistor T1 through the turned-on third transistor T3. Accordingly, the first reference node RN1 connected to the gate G1 of the first transistor T1 is initialized to the initialization voltage Vinit. Then, the third transistor T3 maintains the turned-on state in the second period GCW_2, and the fourth transistor T4 is turned off in the second period GCW_2.

Then, an i-th scan signal GWi is applied to the i-th scan line GWLi. A low level period of the i-th scan signal GWi is also referred to as a scan period GWW. When the second transistor T2 is turned on in the scan period GWW, a data voltage Vdata corresponding to the data signal is applied to the source S1 of the first transistor T1 through the second transistor T2. In this case, the second period GCW_2 and the scan period GWW overlap each other. The first transistor T1 is connected in a diode configuration by the turned-on third transistor T3 in the second period GCW_2 and is forward biased. Then, a compensation voltage Vdata-Vth obtained by reducing the data voltage Vdata applied to the source S1 of the first transistor T1 by a threshold voltage Vth of the first transistor T1 is applied to the gate G1 of the first transistor T1. Accordingly, a voltage of the first reference node RN1 connected to the gate G1 of the first transistor T1 may become the compensation voltage Vdata-Vth. In this case, the power supply voltage ELVDD and the compensation voltage Vdata-Vth are applied to opposite ends of the first capacitor Cst1, respectively, and the first capacitor Cst1 is charged with electric charges corresponding to a voltage difference ELVDD−(Vdata−Vth) between opposite ends. Accordingly, the first transistor T1 is turned on, and the turned-on state of the first transistor T1 is maintained by the electric charges stored in the first capacitor Cst1.

Then, the i-th emission initialization signal EBi is applied to the i-th emission initialization line EBLi. A low level period of the i-th emission initialization signal EBi is also referred to as an emission initialization period EBW. When the seventh transistor T7 is turned on in the emission initialization period EBW, the initialization voltage Vinit is applied to the anode of the light emitting diode OLED through the seventh transistor T7. When the initialization voltage Vinit is applied to the anode of the light emitting diode OLED, it is possible to prevent the light emitting diode OLED from emitting a light with high luminance momentarily due to a voltage remaining in the anode of the light emitting diode OLED at the beginning of driving the light emitting diode OLED. In addition, when the eighth transistor T8 is turned on in the emission initialization period EBW, the bias voltage Vbias is applied to the source S1 of the first transistor T1 through the eighth transistor T8. According to a hysteresis characteristic of the first transistor T1, a driving current I_OLED of the first transistor T1, which is caused by the data voltage Vdata applied in a current frame, is influenced by the data voltage Vdata applied in a previous frame. In detail, although the data voltage Vdata is applied to display an image with a predetermined grayscale in the current frame, an image having a grayscale higher than the predetermined grayscale is displayed in the display device DD in a case where a data voltage Vdata to display an image having a low grayscale is applied in the previous frame. In addition, although the data voltage Vdata is applied to display the image with the predetermined grayscale in the current frame, an image having a grayscale lower than the predetermined grayscale is displayed in the display device DD in a case where a data voltage Vdata to display an image having a high grayscale is applied in the previous frame. Accordingly, when the image IM is displayed in the display device DD, a deterioration in image quality occurs due to a flickering phenomenon or the like, and the image quality deterioration becomes severe since a time desired to apply the data voltage Vdata of the previous frame to the first transistor T1 when the display device DD is operated at a low frequency is longer than that when the display device DD is operated at a high frequency.

In this case, when the bias voltage Vbias is applied to the source S1 of the first transistor T1 through the eighth transistor T8, the luminance difference due to the hysteresis characteristic of the first transistor T1 may be reduced.

Then, the i-th emission signal EMi to turn on a transistor whose gate is electrically connected to the i-th emission line EMLi is applied, and this period is also referred to as the emission period EMW_2. During the emission period EMW_2, the fifth transistor T5 and the sixth transistor T6 are turned on. Accordingly, the driving current I_OLED caused by a difference between a gate voltage of the gate G1 of the first transistor T1 and a source voltage of the source S1 of the first transistor T1 is generated, the driving current I_OLED is provided to the light emitting diode OLED through the fifth and sixth transistors T5 and T6, and as a result, the light emitting diode OLED emits light. According to a current-voltage relationship of the first transistor T1, the driving current I_OLED of the first transistor T1 is in proportion to a square of a value obtained by subtracting a threshold voltage Vth of the first transistor T1 from a gate-source voltage Vgs of the first transistor T1. In the case of the invention, since the gate-source voltage Vgs of the first transistor T1 is (ELVDD-Vdata+Vth), the driving current I_OLED of the first transistor T1 is in proportion to $(ELVDD-Vdata)^2$. Thus, the driving current I_OLED may be determined regardless of the threshold voltage Vth of the first transistor T1.

Referring to FIGS. 2, 3A, 6, and 7, the data signals output from the data driving circuit DDC are written in the display panel DP of the display device DD, and thus, the light emitting diode OLED emits the light. In this case, a frequency at which the data signals are written is referred to as the operating frequency. A frequency of the scan period GWW that turns on the second transistor T2 electrically connected to the data line to write in the data signals is the same as the operating frequency.

In this case, a frequency of the emission period EMW_2 and the emission initialization period EBW in one frame may be greater than the operating frequency. In an embodiment, when the operating frequency of the display device DD is about 120 Hertz (Hz), a frequency of the initialization period GIW, the compensation period GCW, and scan period GWW is about 120 Hz that is the same as the operating frequency, however, the frequency of the emission period EMW_2 and the emission initialization period EBW may be about 480 Hz that is greater than the operating frequency. In addition, when the operating frequency of the display device DD is about 48 Hz, the frequency of the initialization period GIW, the compensation period GCW, and the scan period GWW is about 48 Hz that is the same as the operating frequency, however, the frequency of the emission period EMW_2 and the emission initialization period EBW may be about 480 Hz that is the same as a frequency when the display device DD is operated at a frequency of about 120 Hz. When a timing at which the driving current I_OLED flows to the light emitting diode OLED is controlled by allowing the frequency of the emission period EMW_2 to be greater than the operating frequency of the display device DD, the emission of the light emitting diode OLED may be controlled. In addition, when the frequency of the emission initialization period EBW is greater than the operating frequency of the display device DD, the influence of the data voltage Vdata applied in the previous frame on the first transistor T1, which is caused by the hysteresis characteristic of the first transistor T1, may be reduced, and thus, the deterioration of the image quality such as flickering may be prevented even though the display device DD is operated at the operating frequency. In the illustrated embodiment of the invention, in both the case where the display device DD is operated at the operating frequency of about 120 Hz and the case where the display device DD is operated at the operating frequency of about 48 Hz, the emission initialization period EBW may have the frequency of about 480 Hz, and thus, the influence of the data voltage Vdata of the previous frame due to the hysteresis characteristic of the first transistor T1 when the operating frequency of the display device DD is about 120 Hz may be substantially the same as the influence of the data voltage Vdata of the previous frame due to the hysteresis characteristic of the first transistor T1 when the operating frequency of the display device DD is about 48 Hz. However, the frequency of the emission period EMW_2 and the frequency of the emission initialization period EBW should not be limited thereto or thereby and may be changed in various ways for a global dimming that lowers the luminance in the entire area of the display area DA or a local dimming that lowers the luminance of a portion of the display area DA.

Figure 8:
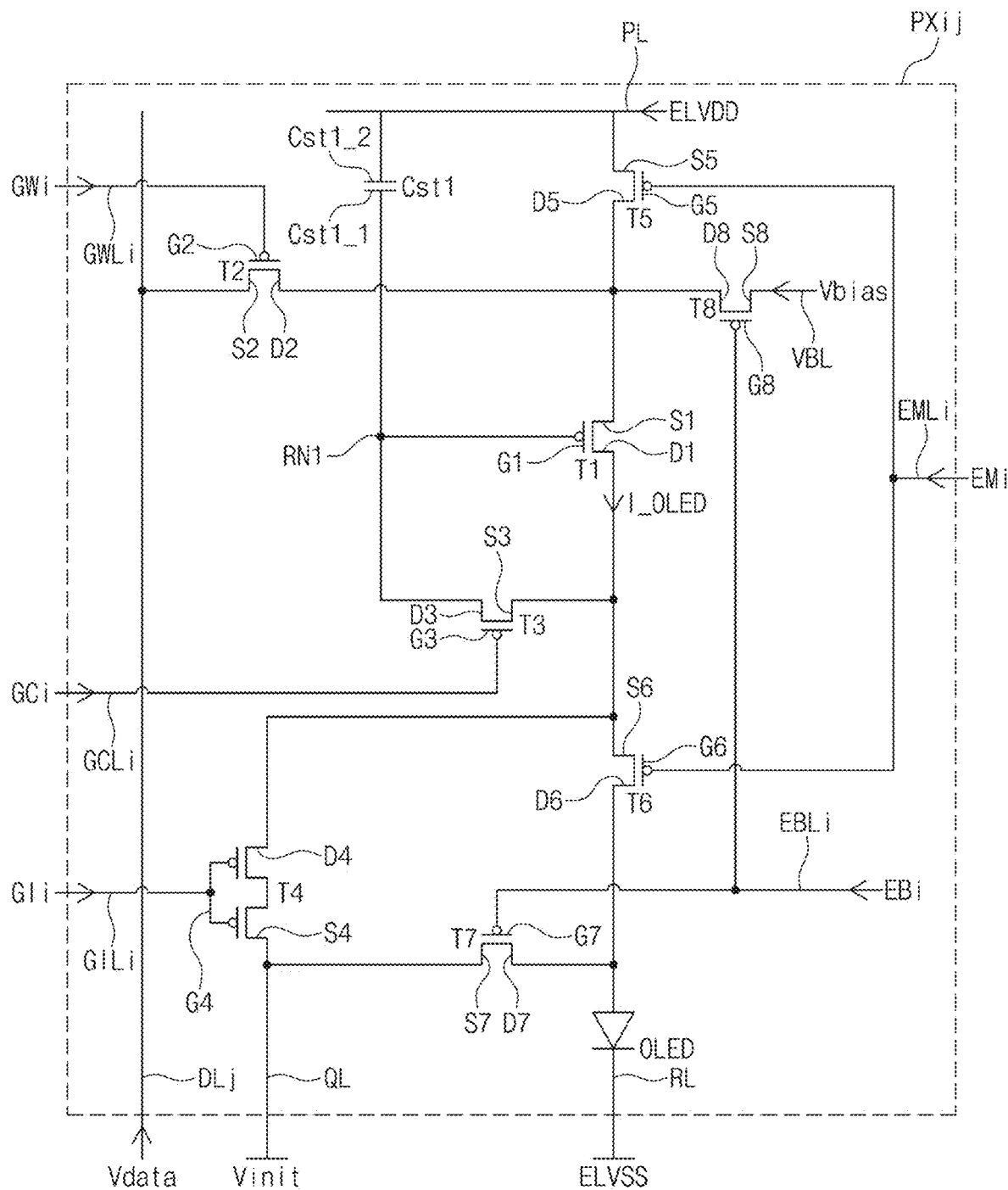
FIG. 8 is an equivalent circuit diagram showing an embodiment of a pixel according to the invention.
Figure 9:
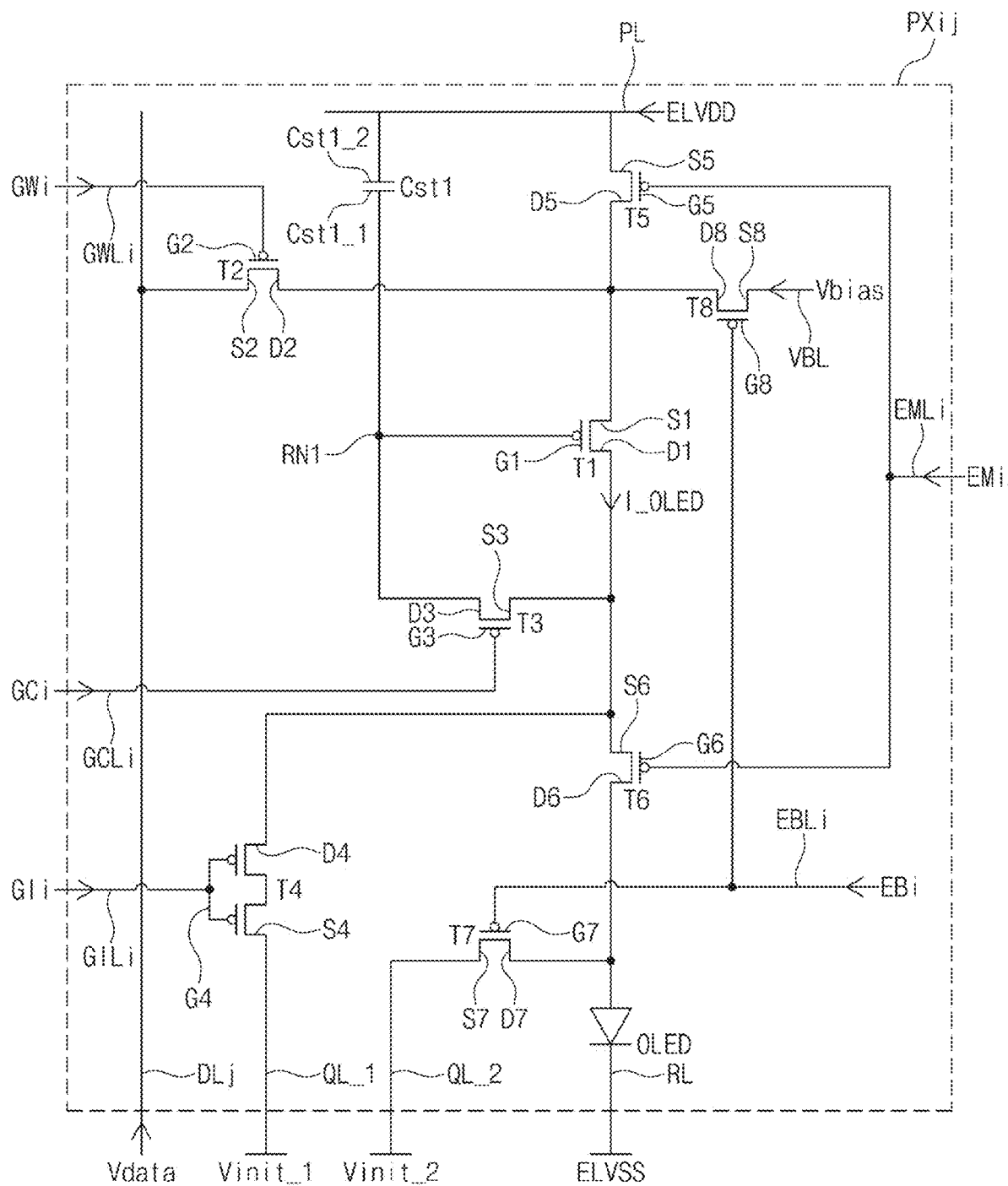
FIG. 9 is an equivalent circuit diagram showing an embodiment of a pixel according to the invention.

FIGS. 8 and 9 are equivalent circuit diagrams showing an embodiment of a pixel PXij according to the invention. Hereinafter, descriptions on the same elements as those described with reference to FIG. 3A will be omitted.

Referring to FIG. 8, a third transistor T3 is connected between a first reference node RN1 and a drain D1 of a first transistor T1. The third transistor T3 includes a first electrode, a second electrode, and a control electrode, the first electrode is a source S3, the second electrode is a drain D3, and the control electrode is a gate G3. The source S3 of the third transistor T3 is electrically connected to a drain D1 of a first transistor T1, and the drain D3 of the third transistor T3 is electrically connected to a first reference node RN1. In the illustrated embodiment, the gate G3 of the third transistor T3 is electrically connected to an i-th compensation scan line GCLi, and the third transistor T3 is turned on in response to an i-th compensation scan signal GCi.

A fourth transistor T4 is connected between the drain D1 of the first transistor T1 and an initialization voltage line QL. The fourth transistor T4 includes a first electrode, a second electrode, and a control electrode, the first electrode is a source S4, the second electrode is a drain D4, and a control electrode is a gate G4. The source S4 of the fourth transistor T4 is electrically connected to the initialization voltage line QL, and the drain D4 of the fourth transistor T4 is electrically connected to the drain D1 of the first transistor T1. In the illustrated embodiment, the gate G4 of the fourth transistor T4 is electrically connected to an i-th initialization scan line GILi, and the fourth transistor T4 is turned on in response to an i-th initialization scan signal Gli. In the illustrated embodiment, the fourth transistor T4 may include a plurality of gates. As the fourth transistor T4 includes the plural gates, a leakage current of the pixel PXij may be reduced.

Referring to FIG. 9, a fourth transistor T4 is connected to a first initialization voltage line QL_1 receiving a first initialization voltage Vinit 1, and a seventh transistor T7 is connected to a second initialization voltage line QL_2 receiving a second initialization voltage Vinit_2. In an embodiment, the second initialization voltage Vinit_2 has a level lower than a level of the first initialization voltage Vinit 1, however, it should not be limited thereto or thereby.

The fourth transistor T4 is connected between the drain D1 of a first transistor T1 and the first initialization voltage line QL_1. The source S4 of the fourth transistor T4 is electrically connected to the first initialization voltage line QL_1, and the drain D4 of the fourth transistor T4 is electrically connected to the drain D1 of the first transistor T1. In the illustrated embodiment, the gate G4 of the fourth transistor T4 is electrically connected to the i-th initialization scan line GILi.

The seventh transistor T7 is connected to an anode of a light emitting diode OLED and the second initialization voltage line QL_2. A source S7 of the seventh transistor T7 is electrically connected to the second initialization voltage line QL_2, and a drain D7 of the seventh transistor T7 is electrically connected to the anode of the light emitting diode OLED. In the illustrated embodiment, a gate G7 of the seventh transistor T7 is electrically connected to the i-th emission initialization line EBLi.

Figure 10:
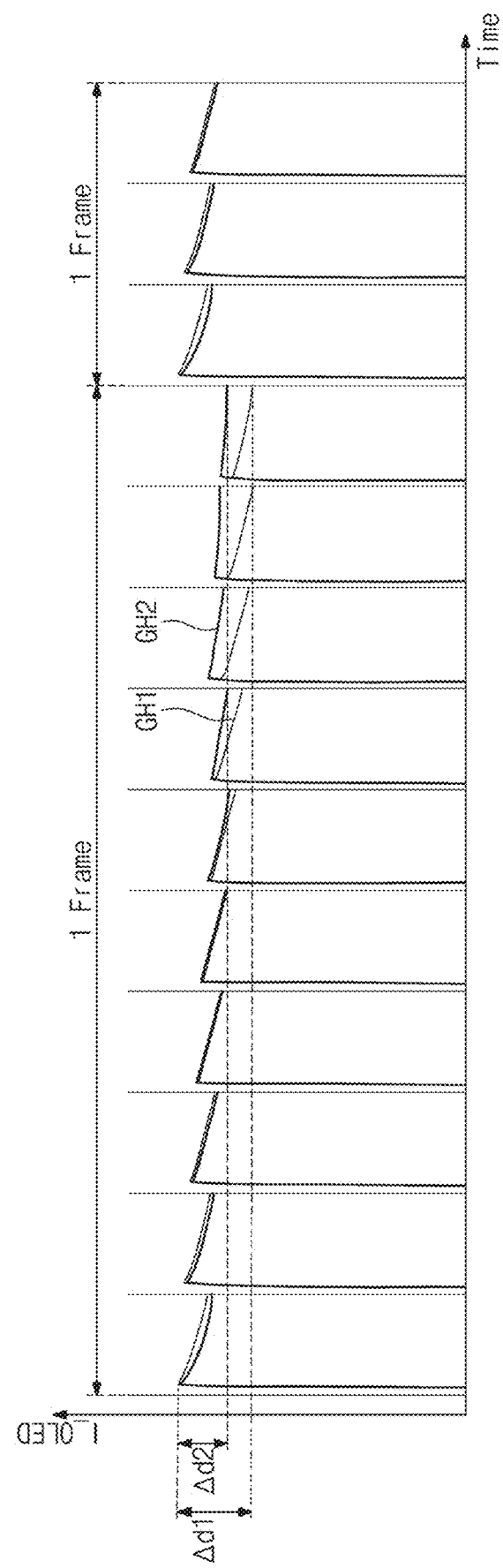
FIG. 10 is a waveform diagram showing an embodiment of a variation in current of a pixel with respect to each operating frequency according to the invention.

FIG. 10 is a waveform diagram showing an embodiment of a luminance of a pixel with respect to each operating frequency according to the invention.

A pixel having a structure in which a drain of a fourth transistor is electrically connected to a gate of a first transistor is also referred to as a comparison pixel. A pixel PXij having a structure in which the drain D4 of the fourth transistor T4 is electrically connected to the second reference node RN2 as shown in FIGS. 3A and 3B or a pixel PXij having a structure in which the drain D4 of the fourth transistor T4 is connected to the drain D1 of the first transistor T1 as shown in FIGS. 8 and 9 is also referred to as an improved pixel.

In FIG. 10, a first graph GH1 shows a variation of a driving current I_OLED flowing to a light emitting diode OLED of the comparison pixel in one frame, and a second graph GH2 shows a variation of the driving current I_OLED flowing to the light emitting diode OLED of the improved pixel in one frame.

Referring to FIGS. 3A and 6, in the one frame, the driving current I_OLED flows to the light emitting diode OLED included in the pixel PXij during the emission period EMW_2. The driving current I_OLED flowing to the light emitting diode OLED during the one frame is determined based on the data voltage Vdata applied to the second transistor T2 during the scan period GWW of the scan signal GWi. In this case, the leakage current may flow through the turned-off transistor due to characteristics of the transistor. During the emission period EMW_2 of the pixel PXij, the driving current I_OLED flowing through the first transistor T1 may flow to the gate G1 of the first transistor T1 from the drain D1 of the first transistor T1 through the turned-off third transistor T3. Accordingly, the electric potential of the gate G1 of the first transistor T1 may increase, and the driving current I_OLED flowing through the first transistor T1 may decrease by the current-voltage relationship of the transistor. The decrease amount of the driving current I_OLED may increase in the one frame as time passes. Accordingly, in the one frame, the driving current I_OLED has a maximum value when the driving current I_OLED starts flowing through the first transistor T1 and the driving current I_OLED has a minimum value right before another data voltage Vdata is applied to the pixel PXij in the scan period GWW of the scan signal GWi in the next frame. In the one frame, a difference between the maximum value and the minimum value of the driving current I_OLED flowing through the first transistor T1 is also referred to as a different value. As the different value increases, the luminance of the display device DD varies for each frame, and the deterioration of the image quality such as flickering occurs even though an image of the same grayscale is displayed for several frames on the display device DD. In case of the comparison pixel, the electric potential of the gate of the first transistor increases by the leakage current since there exists only one path in which the leakage current flowing through the third transistor from the drain of the first transistor flows to a node connected to the gate of the first transistor. The improved pixel as shown in FIGS. 3A and 3B includes a path in which the leakage current flowing through the turned-off third transistor T3 from the drain D1 of the first transistor T1 flows to the node connected to the gate G1 of the first transistor T1 and a path in which the leakage current flowing through the turned-off third transistor T3 from the drain D1 of the first transistor T1 flows to the initialization voltage line QL through the turned-off fourth transistor T4. Accordingly, the increase of the electric potential of the gate G1 of the first transistor T1 due to the leakage current may be prevented compared with the comparison pixel.

The improved pixel as shown in FIGS. 8 and 9, a path, in which the leakage current flowing from the drain D1 of the first transistor T1 flows, includes a path in which the leakage current flowing through the turned-off third transistor T3 flows to the node connected to the gate G1 of the first transistor T1 and a path in which the leakage current flowing through the turned-off fourth transistor T4 flows to the initialization voltage line QL. Thus, in this case, the increase of the electric potential of the gate G1 of the first transistor T1 due to the leakage current may be prevented compared with the comparison pixel.

In addition, according to the improved pixel, since the fourth transistor T4 is connected between the second reference node RN2 and the initialization voltage line QL, it is possible to prevent the gate G1 of the first transistor T1 from being directly influenced by the leakage current through the fourth transistor T4. Accordingly, when the display device DD (refer to FIG. 1) is operated at a low frequency, a decrease in luminance, which occurs in low grayscale images IM (refer to FIG. 1), may be prevented.

In the comparison pixel, a difference between a maximum value and a minimum value of the driving current I_OLED flowing through the first transistor in one frame is referred as a first difference value Δd1. In the improved pixel, a difference between the maximum value and the minimum value of the driving current I_OLED flowing through the first transistor T1 in one frame is referred as a second difference value Δd2. Since the improved pixel may prevent the increase in electric potential of the gate G1 of the first transistor T1, the second difference value Δd2 is smaller than the first difference value Δd1. Accordingly, even though the image of the same grayscale is displayed through the display device DD for several frames, the display device DD including the improved pixel rather than the comparison pixel may prevent the image quality deterioration phenomenon such as flickering from occurring. In an embodiment, although the display device DD is operated at the operating frequency equal to or lower than about 60 Hz, the image quality deterioration phenomenon such as flickering may be prevented as long as the display device DD includes the improved pixel.

Although the embodiments of the invention have been described, it is understood that the invention should not be limited to these embodiments but various changes and modifications may be made by one ordinary skilled in the art within the spirit and scope of the invention as hereinafter claimed.

Therefore, the disclosed subject matter should not be limited to any single embodiment described herein.

What is claimed is:

1. A display device comprising:
   a display panel comprising a plurality of pixels, a pixel of the plurality of pixels comprising:
   a light emitting diode;
   a first capacitor connected between a power line which receives a power supply voltage and a first reference node;
   a first transistor connected between the power line and an anode of the light emitting diode;
   a second transistor connected between a data line and a first electrode of the first transistor;
   a third transistor comprising a plurality of sub-transistors connected between a second electrode of the first transistor and the first reference node in series and receive a compensation scan signal; and
   a fourth transistor connected to a second reference node among a plurality of second reference nodes which are disposed between the plurality of sub-transistors and receive an initialization scan signal,
   wherein the third transistor turned on during an active period of the compensation scan signal and the fourth transistor turned on during an active period of the initialization scan signal,
   wherein the active period of the initialization scan signal overlaps the active period of the compensation scan signal.

2. The display device of claim 1, wherein
the plurality of sub-transistors of the third transistor comprises:
   a first sub-transistor comprising a first electrode connected to the second electrode of the first transistor, a second electrode connected to the second reference node, and a control electrode which receives a compensation scan signal; and
   a second sub-transistor comprising a first electrode connected to the second reference node, a second electrode connected to the first reference node, and a control electrode which receives the compensation scan signal.

3. The display device of claim 2, wherein
the fourth transistor comprises:
   a control electrode which receives the initialization scan signal;
   a first electrode connected to an initialization voltage line which receives an initialization voltage; and
   a second electrode connected to the second reference node.

4. The display device of claim 3, wherein
the compensation scan signal comprises a compensation period in one frame, and the compensation period comprises a first period which overlaps an initialization period of the initialization scan signal and a second period which does not overlap the initialization period.

5. The display device of claim 4, wherein
the first transistor comprises:
   the first electrode connected to the power line; and
   a control electrode connected to the first reference node, and
the second transistor comprises:
   a control electrode which receives a scan signal;
   a first electrode connected to the data line; and
   a second electrode connected to the first electrode of the first transistor.

6. The display device of claim 5, wherein the scan signal comprises a scan period which overlaps the second period in the one frame.

7. The display device of claim 6, further comprising:
   a fifth transistor connected between the power line and the first electrode of the first transistor; and
   a sixth transistor connected between the second electrode of the first transistor and the anode of the light emitting diode, wherein the fifth transistor comprises:
 a control electrode which receives an emission signal;
 a first electrode connected to the power line; and
 a second electrode connected to the first electrode of the first transistor, and the sixth transistor comprises:
 a control electrode which receives the emission signal;
 a first electrode connected to the second electrode of the first transistor; and
 a second electrode connected to the anode of the light emitting diode.

8. The display device of claim 7, further comprising a seventh transistor connected between the anode of the light emitting diode and the initialization voltage line, wherein the seventh transistor comprises:
 a control electrode which receives an emission initialization signal;
 a first electrode connected to the initialization voltage line; and
 a second electrode connected to the anode of the light emitting diode.

9. The display device of claim 8, further comprising an eighth transistor connected between the first electrode of the first transistor and a bias voltage line which receives a bias voltage.

10. The display device of claim 9, wherein the eighth transistor comprises:
 a control electrode which receives an emission initialization signal;
 a first electrode connected to the bias voltage line; and
 a second electrode connected to the first electrode of the first transistor.

11. The display device of claim 10, wherein the initialization period, the compensation period, and the scan period are ahead of an emission initialization period of the emission initialization signal in the one frame, and the initialization period, the compensation period, the scan period, and the emission initialization period are in a non-emission period of the emission signal in the one frame.

12. The display device of claim 1, further comprising a fifth transistor which is connected to the anode of the light emitting diode and receives an emission initialization signal, wherein the fourth transistor comprises:
 a control electrode which receives the initialization scan signal;
 a first electrode connected to a first initialization voltage line which receives a first initialization voltage; and
 a second electrode connected to the second reference node, and the fifth transistor comprises:
 a control electrode which receives the emission initialization signal;
 a first electrode connected to a second initialization voltage line which receives a second initialization voltage; and
 a second electrode connected to the anode of the light emitting diode.

13. The display device of claim 1, further comprising a second capacitor connected between the second reference node and the power line.

14. A display device comprising:
a display panel comprising a plurality of pixels, a pixel of the plurality of pixels comprising:
 a light emitting diode;
 a first capacitor connected between a power line which receives a power supply voltage and a first reference node;
 a first transistor connected between the power line and an anode of the light emitting diode;
 a second transistor connected between a data line and a first electrode of the first transistor and turned on in response to a scan signal;
 a third transistor connected between a second electrode of the first transistor and the first reference node and turned on during an active period a compensation scan signal; and
 a fourth transistor connected to the second electrode of the first transistor and turned on during an active period an initialization scan signal,
the active period of the compensation scan signal comprises a first period which overlaps the active period of the initialization scan signal and a second period following the first period.

15. The display device of claim 14, wherein the third transistor comprises:
 a control electrode which receives the compensation scan signal;
 a first electrode connected to the second electrode of the first transistor; and
 a second electrode connected to the first reference node, the fourth transistor comprises:
 a control electrode which receives the initialization scan signal;
 a first electrode connected to an initialization voltage line; and
 a second electrode connected to the second electrode of the first transistor.

16. The display device of claim 15, further comprising:
a fifth transistor connected between the power line and the first electrode of the first transistor; and
a sixth transistor connected between the second electrode of the first transistor and the anode of the light emitting diode, wherein the fifth transistor comprises:
 a control electrode which receives an emission signal;
 a first electrode connected to the power line; and
 a second electrode connected to the first electrode of the first transistor, and the sixth transistor comprises:
 a control electrode which receives the emission signal;
 a first electrode connected to the second electrode of the first transistor; and
 a second electrode connected to the anode of the light emitting diode.

17. The display device of claim 16, further comprising a seventh transistor connected between the anode of the light emitting diode and the initialization voltage line, wherein the seventh transistor comprises:
 a control electrode which receives an emission initialization signal;
 a first electrode connected to the initialization voltage line; and
 a second electrode connected to the anode of the light emitting diode.

18. The display device of claim 17, further comprising an eighth transistor connected between the first electrode of the first transistor and a bias voltage line which receives a bias voltage, wherein the eighth transistor comprises:
 a control electrode which receives an emission initialization signal;

a first electrode connected to the bias voltage line; and a second electrode connected to the first electrode of the first transistor.

19. The display device of claim 18, wherein the active period of the initialization scan signal, and the active period of the compensation scan signal are ahead of an emission initialization period of the emission initialization signal in the one frame, and the active period of the initialization scan signal and the active period of the compensation scan signal are in a non-emission period of the emission signal in the one frame.

20. The display device of claim 14, further comprising a fifth transistor which is connected to the anode of the light emitting diode and receives an emission initialization signal, wherein the fourth transistor comprises:

a control electrode which receives the initialization scan signal;

a first electrode connected to a first initialization voltage line which receives a first initialization voltage; and a second electrode connected to the second electrode of the first transistor, and the fifth transistor comprises:

a control electrode which receives the emission initialization signal;

a first electrode connected to a second initialization voltage line which receives a second initialization voltage; and a second electrode connected to the anode of the light emitting diode.

\* \* \* \* \*